(12) United States Patent
O'Donnell et al.

(10) Patent No.: US 9,953,114 B2
(45) Date of Patent: Apr. 24, 2018

(54) DESIGNING A DRILLSTRING

(71) Applicants: Brian J. O'Donnell, Houston, TX (US); Kaustubh S. Kulkarni, Pearland, TX (US)

(72) Inventors: Brian J. O'Donnell, Houston, TX (US); Kaustubh S. Kulkarni, Pearland, TX (US)

(73) Assignee: ExxonMobil Upstream Research Company, Spring, TX (US)

(*) Notice: Subject to any disclaimer, the term of this patent is extended or adjusted under 35 U.S.C. 154(b) by 921 days.

(21) Appl. No.: 14/375,405

(22) PCT Filed: Mar. 15, 2013

(86) PCT No.: PCT/US2013/032536
§ 371 (c)(1),
(2) Date: Jul. 29, 2014

(87) PCT Pub. No.: WO2013/148362
PCT Pub. Date: Oct. 3, 2013

(65) Prior Publication Data
US 2015/0012253 A1 Jan. 8, 2015

Related U.S. Application Data

(60) Provisional application No. 61/616,264, filed on Mar. 27, 2012.

(51) Int. Cl.
*G06G 7/48* (2006.01)
*G06F 17/50* (2006.01)
*E21B 17/00* (2006.01)

(52) U.S. Cl.
CPC .......... *G06F 17/5009* (2013.01); *E21B 17/00* (2013.01)

(58) Field of Classification Search
CPC .................................................. G06F 17/5009
(Continued)

(56) References Cited

U.S. PATENT DOCUMENTS

| 4,760,735 A | 8/1988 | Sheppard et al. |
| 4,972,703 A | 11/1990 | Ho |

(Continued)

OTHER PUBLICATIONS

Bhalla, K. et al., "The Effect of Fluid Flow on Coiled-Tubing Reach", SPE Production & Facilities, Feb. 1998, pp. 59-63.

(Continued)

*Primary Examiner* — Hugh Jones
(74) *Attorney, Agent, or Firm* — ExxonMobil Upstream Research Company—Law Department

(57) ABSTRACT

Designing a drillstring in for use in a wellbore, such as a deviated or horizontal wellbore, particularly with application to extended reach wellbores. Method comprises determining the downhole weight-on-bit transmitted by a drillstring by determining a baseline tension profile and baseline torque profile in a drill string rotating off-bottom, and then using such profiles in conjunction with a selected surface weight-on-bit slack-off value to calculate a drillstring tension profile and rotating torque profile with the bit on bottom and having weight applied thereto. The method includes buckling limit checks and rig operational limit checks to determine if sufficient torque and DWOB can be transmitted through the drillstring, and to determine whether the drill string remains operable even though portions thereof may be in a buckled condition.

30 Claims, 10 Drawing Sheets

(58) Field of Classification Search
USPC .......................................................... 703/10
See application file for complete search history.

(56) References Cited

U.S. PATENT DOCUMENTS

| | | |
|---|---|---|
| 6,450,259 B1 | 9/2002 | Song et al. |
| 6,612,382 B2 | 9/2003 | King |
| 6,662,110 B1 | 12/2003 | Bargach et al. |
| 7,261,167 B2 | 8/2007 | Goldman et al. |
| 7,357,196 B2 | 4/2008 | Goldman et al. |
| 7,556,104 B2 | 7/2009 | Jeffryes |
| 7,730,967 B2 | 6/2010 | Ballantyne et al. |
| 2003/0195733 A1 | 10/2003 | Huang et al. |
| 2005/0211468 A1 | 9/2005 | Veeningen et al. |
| 2009/0157319 A1 | 6/2009 | Mitchell |
| 2009/0319241 A1 | 12/2009 | Samuel |
| 2010/0032165 A1 | 2/2010 | Bailey et al. |
| 2010/0133008 A1 | 6/2010 | Gawski et al. |
| 2010/0185395 A1 | 7/2010 | Pirovolou et al. |
| 2010/0307742 A1 | 12/2010 | Phillips et al. |
| 2011/0077924 A1 | 3/2011 | Ertas et al. |
| 2011/0166837 A1 | 7/2011 | Servaes et al. |
| 2012/0059521 A1 | 3/2012 | Iversen et al. |
| 2012/0116738 A1 | 5/2012 | Mitchell |

OTHER PUBLICATIONS

Dawson, R. et al., "Drillpipe Buckling in Inclined Holes", Journal of Petroleum Technology, Sep. 1982, pp. 1734-1738.

Johancsik, C.A. et al., "Torque and Drag in Directional Wells-Prediction and Measurement", Journal of Petroleum Technology, Jun. 1984, pp. 987-992.

Mitchell, R., "Tubing Buckling—The State of the Art", SPE Drilling & Completion, Dec. 2008, pp. 361-370.

Mitchell, S. et al., "Comparing the Results of a Full-Scale Buckling Test Program to Actual Well Data: New Semi-Empirical Buckling Model and Methods of Reducing Buckling Effects", SPE 144535, May 2011, pp. 1-20.

Paslay, P.R., "Stress Analysis of Drillstrings", SPE 27976, Aug. 1994, pp. 187-200.

Sheppard, M.C. et al., "Designing Well Paths to Reduce Drag and Torque" SPE Drilling Engineering, Dec. 1987, pp. 344-350.

Walker, M.W., "Pushing the Extended Reach Envelope at Sakalin: An Operator's Experience Drilling a Record Reach Well", IADS/SPE 151046, Mar. 2012, pp. 1-11.

Wu, J., "Slack-off Load Transmission in Horizontal and Inclined Wells", SPE 29496, Apr. 1995, pp. 489-494.

Zhang, Q. et al., "Critical Flow Rate for the Buckling of Nonrotating Drillpipe Conveying Fluid in Vertical Holes", SPE 63195, Oct. 2000, pp. 1-14.

100

112

112

500

600

800

900

DESIGNING A DRILLSTRING

CROSS REFERENCE TO RELATED APPLICATIONS

This application is the National Stage of International Application No. PCT/US2013/032536, filed Mar. 15, 2013, which claims the benefit of U.S. Provisional Application No. 61/616,264, filed Mar. 27 2012, the entirety of which is incorporated herein by reference for all purposes.

FIELD

Embodiments of the present techniques relate to a method and system for designing a drillstring for us in preparing a borehole in an earthen formation, such as may be useful as a wellbore. The wellbore may be of substantially any directional orientation, but the methods disclosed herein may have particularly utility in regards to wellbores having substantial tangential loading and/or torqueing upon the drill string, such as in deviated, horizontal, and extended reach drilling (ERD) wellbores. Specifically, techniques described herein may be useful to determine if buckling of a drillstring is likely to occur, if sufficient downhole weight-on-bit (DWOB) can be transmitted to the bit, and if the rotating torque remains in an operable region with respect to drilling rig and drillstring equipment limitations.

BACKGROUND

This section is intended to introduce various aspects of the art that may be topically associated with embodiments of the present techniques. This discussion is believed to assist in providing a framework to facilitate a better understanding of particular aspects of the present techniques. Accordingly, it should be understood that this section should be read in this light, and not necessarily as admissions of prior art.

Wellbores, for example, to reach hydrocarbon resources, are drilled using long pipe segments, which are joined together to form a drillstring. The drillstring typically terminates at a lower end with a drill bit ("bit"), which may be rotated from the surface by rotating the drillstring. Consequently, portions of the drill string may be in tension while other portions are in compression. A major portion of the drillstring is generally suspended in the borehole in tension, with a controlled amount of weight actually applied to the bit by portions of the drillstring itself. The actual weight-on-bit (WOB) may often be provided to the bit by one or more drill collars attached to the lower end of the drillstring above the bit. The WOB is applied by "slacking off" the tensioners on the rig floor. Drill collars are typically thick walled and provide more buckling resistance when applying WOB. Accordingly, the neutral point on the drillstring is often set to the point at which the drill collars start. Rotation of the bit through the drillstring, combined with a WOB, causes the bit to penetrate subsurface formations, as measured by a rate-of-penetration (ROP).

During drilling, the drillstring may buckle. Buckling is a deformation of the drillstring caused by the drillstring not being able to support an imposed compressive force. Buckling of the drillstring may be sinusoidal or helical. In either case, the drillstring touches the walls of the boreholes, creating additional friction and increasing the amount of torque required to turn the drillstring. The amount of force communicated to the drill bit, e.g., the WOB, also decreases, which may lower the efficacy of the drilling operation, e.g., as measured by the ROP. In the case of sinusoidal buckling, the drillstring touches the walls of the borehole at a number of points along the borehole, but the drillstring may still be rotated, depending on the amount of torque available from the drilling rig at the surface. In contrast, helical buckling places an entire section of the drillstring in contact with the wellbore, which will often increase the torque to levels that are too high for continued drilling. Further, helical buckling can lead to lock up, in which the drillstring cannot be turned or removed from the borehole.

Models have been developed to identify conditions that are likely to lead to buckling. For example, in Dawson, R. and Paslay, P. R., "Drillpipe Buckling in Inclined Holes", SPE Paper 11, 167, September 1982, the authors present an equation used for buckling prediction of drill pipe in an inclined hole. These equations have been used to develop software to generate buckling threshold limits of a drillstring assembly at every point along the well path.

Further, techniques have been developed to model forces placed on a drillstring during operations. Johancsik et al., "Torque and Drag in Directional Wells—Prediction and Measurement," IADC/SPE Paper 11,380, February 1983, present a mathematical technique to predict torque and drag in a wellbore. A computer program developed from the theory is also discussed. The equations for the modeling are presented in differential form in Sheppard et al., "Designing Well Paths to Reduce Drag and Torque," SPE Paper 15,463, October 1986. Sheppard also discusses the concept of using simpler wellbore trajectories to reduce torque and drag. This is discussed further in U.S. Pat. No. 4,760,735, to Sheppard, which discloses a "method and apparatus for investigating drag and torque loss in the drilling process."

A parameter called effective tension is discussed in Paslay, P. R., "Stress Analysis of Drillstrings," SPE 27,976, August 1994. The effective tension is related to the true tension by accounting for the internal and external pressure on the drillstring, caused by fluid flow through and around the drillstring. The paper indicates that the effective tension may be used to determine if the string is buckled. If the drillstring is buckled, various techniques may be used to determine the decrease in the WOB caused by the transfer of part of that weight to the walls of the wellbore. See, for example, Wu, J., "Slack-off Load Transmission in Horizontal and Inclined Wells," SPE paper 29,496, April 1995 (which presents a model to calculate the load (weight-on-bit) transfer inside a sinusoidally or helically buckled drillpipe).

Related information may be found in U.S. Patent Application Publication Nos. 2010/0133008; 2009/0157319; 2009/0319241; 2010/0185395; 2010/0307742; and 2011/005262. Further related information may be found in International Patent Publication Nos. WO 2010/101473 and WO 2011/005262. Other references which may contain related information are U.S. Pat. Nos. 4,792,703; 6,450,259; 6,612,382; 6,662,110; 7,261,167; 7,357,196; 7,730,967; and 7,556,104. Non patent literature references which may be related include Kenneth Bhalla, et al., "The Effect of Fluid Flow on Coiled-Tubing Reach," SPE Production and Facilities, February 1998, pp. 59-63; and Robert F. Mitchell, "Tubing Buckling—The State of the Art," SPE 104,267, December 2008.

Many of the techniques described in the references above may be useful for designing a drillstring and decreasing the likelihood of buckling in an enclosing annulus, such as in a borehole being prepared for use as a wellbore. The forces on the drillstring consist at least in part of tension/compression and torsional forces that are calculated by summing the individual segments of torque and drag generated at the bottom of the string all the way up to the surface. These "bottom-up" calculation techniques must assume a downhole weight-on-bit (DWOB) value and then back-calculate to the surface or drilling rig to determine what the hookload must be to obtain such DWOB. However, such techniques do not strictly conform to what is actually known on the rig surface during drilling operations, wherein one can readily measure the surface weight-on-bit (SWOB) and unless a downhole WOB measurement tool is used in the drill string, the actual WOB is only inferred and not confidently known. A method is needed that relies upon the known surface WOB (hook-load set-off) to accurately calculate at least one of the DWOB, a drill strong tension profile with WOB, and/or a drillstring rotating torque profile, by starting the determination from the top of the drillstring and marching or proceeding by calculation down to the bit, along each of the drill string compositional elements.

SUMMARY

An embodiment described herein provides a method for designing a drillstring in a deviated wellbore. The method includes determining a baseline solution for the drillstring rotating torque profile along a length of the drill string, and determining the tension profile in a drillstring, with the drill string rotating the bit off-bottom (meaning substantially zero or no effective downhole weight-on-bit (DWOB)). The actual WOB is then determined using the baseline solutions by inputting into the method or processor, a selected surface weight-on-bit (SWOB) and calculating a WOB drillstring tension profile and rotating torque profile with the bit on-bottom (having WOB applied thereon) in a rotating mode, and determining whether the tension indicates that the drillstring will buckle in a surrounding annulus, and if the drillstring will buckle, determining the torque required to rotate the drillstring in a buckled configuration and the DWOB lost due to an increase of wellbore frictional forces.

The disclosed method also provides a process for designing a drillstring to drill a borehole for creating a wellbore, the method comprising the steps of: (a) determining drillstring design parameters and identifying (and rig) equipment operational torque limits; (b) determining drilling operational parameters; (c) calculating both a baseline drillstring tension profile and a baseline drillstring rotating torque profile, while rotating the drillstring off bottom (e.g., substantially no downhole WOB); (d) providing non-transitory computer readable instructions to a computer processor and inputting into the processor (i) a surface WOB value with bit on bottom and in a rotating mode, (ii) the baseline drillstring tension profile and (iii) the baseline drillstring rotating torque profile, to calculate a WOB drillstring tension profile and a WOB rotating torque profile; and (e) adjust at least one of the drillstring design parameters and drilling operational parameters if the determined WOB rotating torque profile (including the torque at the bit) exceeds the identified equipment operational torque limits. Such process may be utilized while planning the drilling system, while actually performing drilling operations, or in post-drill performance review.

A related aspect provides a system for designing a drillstring, the system including a processing unit (such as for receiving information from non-transient media) configured to implement modules and a storage device configured to hold modules. The storage device includes a torque and drag model of a drillstring and a hydraulics model of the drillstring. A module is configured to calculate an effective tension in the drillstring using the torque and drag model and the hydraulics model. Another module is configured to calculate a torque for rotating a drillstring that is in a buckled configuration and the resulting downhole weight-on-bit (DWOB).

The invention also includes a method for harvesting a hydrocarbon from a reservoir. The method includes modeling a design for a well using a torque and drag model coupled to a hydraulics model to determine an effective tension in a drillstring. The effective tension is compared to a calculated limit to determining if buckling is likely to occur in the drillstring, and, if buckling is likely to occur, a torque is calculated for rotating the drillstring in the well. The design is adjusted to keep the torque within operational limits for a rig while still having the capability to transmit downhole weight-on-bit (DWOB). The well is drilled to the reservoir following the design. The well is completed, and hydrocarbons are harvested from the reservoir.

Another embodiment provides a non-transitory computer readable medium including code configured to direct a processing unit. The code is configured to direct the processing unit to calculate an effective tension on a drillstring and compare the effective tension to a buckling limit to determine if a modeled drillstring would be buckled, and determine if the drillstring would be operable in a buckled configuration.

DESCRIPTION OF THE DRAWINGS

The advantages of the present techniques are better understood by referring to the following detailed description and the attached drawings, in which.

DETAILED DESCRIPTION

Figure 1:
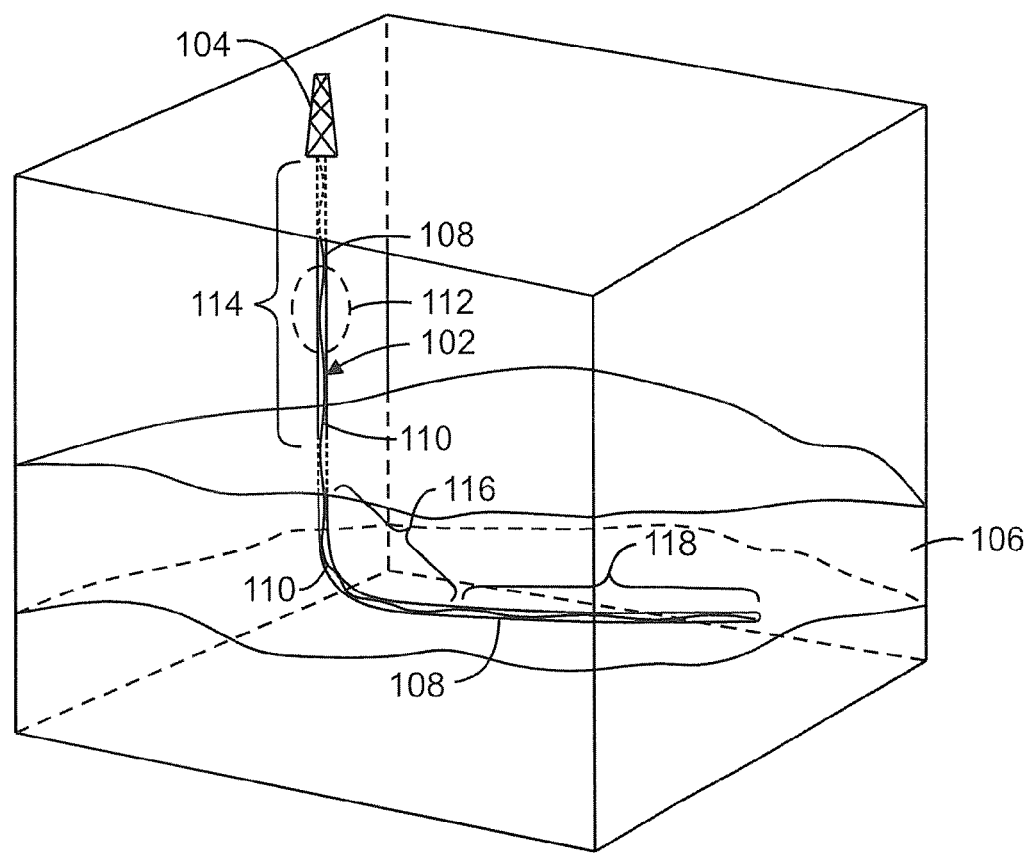
FIG. 1 is a schematic of an extended reach well drilled from a drilling rig into a reservoir.

In the following detailed description section, the specific embodiments of the method are described in connection with exemplary embodiments. However, to the extent that the following description is specific to a particular embodiment or a particular use of the present techniques, this is intended to be for exemplary purposes only and simply provides a description of the exemplary embodiments. Accordingly, the present techniques are not limited to the specific embodiments described below, but rather, such techniques include all alternatives, modifications, and equivalents falling within the true spirit and scope of the appended claims.

At the outset, and for ease of reference, certain terms used in this application and their meanings as used in this context are set forth. To the extent a term used herein is not defined below, it should be given the broadest definition persons in the pertinent art have given that term as reflected in at least one printed publication or issued patent. Further, the present techniques are not limited by the usage of the terms shown below, as all equivalents, synonyms, new developments, and terms or techniques that serve the same or a similar purpose are considered to be within the scope of the present claims.

"BHA" or "bottomhole assembly" is a tubular assembly forming part of a drillstring with a drill bit attached to the bottom end thereof. The drill bit is rotated to disintegrate the earth formations to drill the wellbore. The BHA includes devices and sensors for providing information about a variety of parameters relating to the drilling operations (drilling parameters), behavior of the BHA (BHA parameters), and formation surrounding the wellbore being drilled (formation parameters). Drilling parameters include weight-on-bit ("WOB"). Weight-on-bit is also known from surface measurements. A certain amount of WOB is applied by slacking off on the rig floor. The downhole weight-on-bit (DWOB) measurement devices should correspond to the value on the rig floor; however there will be losses due to wellbore frictional forces. If the drillstring is buckled we expect more losses to occur and the downhole value to be less than the surface value as indicated in our plots and the field trial. Other parameters include rotational speed (revolutions per minute or "RPM") of the drill bit and BHA, rate of penetration ("ROP") of the drill bit into the formation, and flow rate of the drilling fluid through the drillstring. The BHA parameters typically include torque, whirl, vibrations, bending moments and stick-slip. Formation parameters include various formation characteristics, such as resistivity, porosity and permeability, etc.

A "bit," or "drill bit," as used herein, includes, but is not limited to anti-whirl bits, bicenter bits, diamond bits, drag bits, fixed-cutter bits, polycrystalline diamond compact bits, roller-cone bits, and the like. The choice of bit, like the choice of drilling mud, is dictated in part by the nature of the formation in which drilling is to take place. The drill bit may be the same or different for the offset and uncased intervals of the wells.

"Directional drilling" is the intentional deviation of the wellbore from the path it would naturally take. In other words, directional drilling is the steering of the drillstring so that it travels in a desired direction. Directional drilling can be used for increasing the drainage of a particular well, for example, by forming deviated branch bores from a primary borehole. Directional drilling is also useful in the marine environment where a single offshore production platform can reach several hydrocarbon bearing subterranean formations or reservoirs by utilizing a plurality of deviated wells that can extend in any direction from the drilling platform. Directional drilling also enables horizontal drilling through a reservoir to form a horizontal wellbore. As used herein, "horizontal wellbore" represents the portion of a wellbore in a subterranean zone to be completed which is substantially horizontal or at an angle from vertical in the range of from about 50° to about 85°. A horizontal wellbore may have a longer section of the wellbore traversing the payzone of a reservoir, thereby permitting increases in the production rate from the well.

"Drilling" may include, but is not limited to, rotational drilling, directional drilling, non-directional (straight or linear) drilling, deviated drilling, geosteering, horizontal drilling, and the like. Rotational drilling may involve rotation of the entire drillstring, or local rotation downhole using a drilling mud motor, where by pumping mud through the mud motor, the bit turns while the drillstring does not rotate or turns at a reduced rate, allowing the bit to drill in the direction it points. A turbodrill may be one tool used in the latter scenario. A turbodrill is a downhole assembly of bit and motor in which the bit alone is rotated by means of fluid turbine which is activated by the drilling mud. The mud turbine is usually placed just above the bit.

"Exemplary" is used exclusively herein to mean "serving as an example, instance, or illustration." Any embodiment described herein as exemplary is not to be construed as preferred or advantageous over other embodiments.

A "facility" is tangible piece of physical equipment, or group of equipment units, through which hydrocarbon fluids are either produced from a reservoir or injected into a reservoir. In its broadest sense, the term facility is applied to any equipment that may be present along the flow path between a reservoir and its delivery outlets, which are the locations at which hydrocarbon fluids either leave the model (produced fluids) or enter the model (injected fluids). Facilities may comprise production wells, injection wells, well tubulars, wellhead equipment, gathering lines, manifolds, pumps, compressors, separators, surface flow lines, and delivery outlets. In some instances, the term "surface facility" is used to distinguish those facilities other than wells.

"Formation" refers to a body or section of geologic strata, structure, or other subsurface solids or collected material that is sufficiently distinctive and continuous with respect to other geologic strata or other characteristics that it can be mapped, for example, by seismic techniques. A formation can be a body of geologic strata of predominantly one type of rock or a combination of types of rock, or a fraction of strata having substantially common set of characteristics. A formation can contain one or more hydrocarbon-bearing subterranean formations. Note that the terms formation, hydrocarbon bearing subterranean formation, reservoir, and interval may be used interchangeably, but may generally be used to denote progressively smaller subsurface regions, zones, or volumes. More specifically, a geologic formation may generally be the largest subsurface region, a hydrocarbon reservoir or subterranean formation may generally be a region within the geologic formation and may generally be a hydrocarbon-bearing zone, a formation, reservoir, or interval having oil, gas, heavy oil, and any combination thereof. An interval or production interval may generally refer to a sub-region or portion of a reservoir. A hydrocarbon-bearing zone, or production formation, may be separated from other hydrocarbon-bearing zones by zones of lower permeability such as mudstones, shales, or shale-like (highly compacted) sands. In one or more embodiments, a hydrocarbon-bearing zone may include heavy oil in addition to sand, clay, or other porous solids.

"Hydrocarbon production" refers to any activity associated with extracting hydrocarbons from a well or other opening. Hydrocarbon production normally refers to any activity conducted in or on the well after the well is completed. Accordingly, hydrocarbon production or extraction includes not only primary hydrocarbon extraction but also secondary and tertiary production techniques, such as injection of gas or liquid for increasing drive pressure, mobilizing the hydrocarbon or treating by, for example chemicals or hydraulic fracturing the wellbore to promote increased flow, well servicing, well logging, and other well and wellbore treatments.

"Hydrocarbons" are generally defined as molecules formed primarily of carbon and hydrogen atoms such as oil and natural gas. Hydrocarbons may also include other elements, such as, but not limited to, halogens, metallic elements, nitrogen, oxygen, and/or sulfur. Hydrocarbons may be produced from hydrocarbon bearing subterranean formations through wells penetrating a hydrocarbon containing formation. Hydrocarbons derived from a hydrocarbon bearing subterranean formation may include, but are not limited to, kerogen, bitumen, pyrobitumen, asphaltenes, oils, natural gas, or combinations thereof. Hydrocarbons may be located within or adjacent to mineral matrices within the earth. Matrices may include, but are not limited to, sedimentary rock, sands, silicilytes, carbonates, diatomites, and other porous media.

As used herein, "material properties" represents any number of physical constants that reflect the behavior of a rock. Such material properties may include, for example, Young's modulus (E), Poisson's Ratio (v), tensile strength, compressive strength, shear strength, creep behavior, and other properties. The material properties may be measured by any combinations of tests, including, among others, a "Standard Test Method for Unconfined Compressive Strength of Intact Rock Core Specimens," ASTM D 2938-95; a "Standard Test Method for Splitting Tensile Strength of Intact Rock Core Specimens [Brazilian Method]," ASTM D 3967-95a Reapproved 1992; a "Standard Test Method for Determination of the Point Load Strength Index of Rock," ASTM D 5731-95; "Standard Practices for Preparing Rock Core Specimens and Determining Dimensional and Shape Tolerances," ASTM D 4435-01; "Standard Test Method for Elastic Moduli of Intact Rock Core Specimens in Uniaxial Compression," ASTM D 3148-02; "Standard Test Method for Triaxial Compressive Strength of Undrained Rock Core Specimens Without Pore Pressure Measurements," ASTM D 2664-04; "Standard Test Method for Creep of Cylindrical Soft Rock Specimens in Uniaxial Compressions," ASTM D 4405-84, Reapproved 1989; "Standard Test Method for Performing Laboratory Direct Shear Strength Tests of Rock Specimens Under Constant Normal Stress," ASTM D 5607-95; "Method of Test for Direct Shear Strength of Rock Core Specimen," U.S. Military Rock Testing Handbook, RTH-203-80, available at "http://www.wes.army.mil/SUMTC/handbook/RT/RTH/203-80.pdf" (last accessed on Oct. 1, 2010); and "Standard Method of Test for Multistage Triaxial Strength of Undrained Rock Core Specimens Without Pore Pressure Measurements," U.S. Military Rock Testing Handbook, available at http://www.wes.army.mil/SL/MTC/handbook/RT/RTH/204-80.pdf" (last accessed on Jun. 25, 2010). One of ordinary skill will recognize that other methods of testing rock specimens from formations may be used to determine the physical constants used herein.

"Pressure" refers to a force acting on a unit area. Pressure is usually shown as pounds per square inch (psi). "Atmospheric pressure" refers to the local pressure of the air. Local atmospheric pressure is assumed to be 14.7 psia, the standard atmospheric pressure at sea level. "Absolute pressure" (psia) refers to the sum of the atmospheric pressure plus the gauge pressure (psig). "Gauge pressure" (psig) refers to the pressure measured by a gauge, which indicates only the pressure exceeding the local atmospheric pressure (a gauge pressure of 0 psig corresponds to an absolute pressure of 14.7 psia).

As used herein, "rotating" a drillstring involves turning the drillstring at the surface and having the drillstring at the bit turning in response. The rotation at the bit does not have to be smooth or continuous, as the bit may rotate in a "stick-slip" manner. In a stick-slip rotation, force builds up in the drillstring, which overcomes friction between the walls of the wellbore and the drillstring, causing the drillstring to snap to a new rotational position. This type of rotation may be more prevalent when the drillstring is in a buckled configuration.

As previously mentioned, a "reservoir" or "hydrocarbon reservoir" is defined as a pay zone or production interval (for example, a hydrocarbon bearing subterranean formation) that includes sandstone, limestone, chalk, coal, and some types of shale. Pay zones can vary in thickness from less than one foot (0.3048 m) to hundreds of feet (hundreds of m). The permeability of the reservoir formation provides the potential for production.

"Substantial" when used in reference to a quantity or amount of a material, or a specific characteristic thereof, refers to an amount that is sufficient to provide an effect that the material or characteristic was intended to provide. The exact degree of deviation allowable may in some cases depend on the specific context.

"Torque" is a measurement of the force applied to an object that causes the object to turn. Mathematically, torque (T) is the cross product of the distance vector (r) and the force vector (F):

$$T = r \times F = rF \sin(\theta)$$

In embodiments described herein, torque is applied to a drill string by equipment on a drilling rig, causing the drillstring to rotate at the surface, causing the bit at the drillstring to rotate in a wellbore in the subsurface and extend the wellbore. The rotation does not have to be smooth, as discussed above.

A "wellbore" generally refers to a hole in a formation made by drilling. A wellbore may have a substantially circular cross-section, or a cross-section in other shapes as well (e.g., circles, ovals, squares, rectangles, triangles, slits, or other regular or irregular shapes). The term "well," when referring to an opening in the formation, may also be used interchangeably with the term "wellbore." Further, a wellbore may be cased, partially, cased, or uncased in embodiments described herein.

Overview

Extended reach drilling (ERD) wells have pushed the envelope of current modeling capabilities. For example, torque and drag models used to determine forces and conditions of drillstrings do not account for effects inherent in long or directional wells. The current modeling techniques for drillstrings suffice for vertical and low angle wells where hydraulic forces are typically small and wellbore friction is easily overcome. In these types of wells the effects of wellbore friction and hydraulic forces on torque and drag parameters may not be noticeable. However, for wells with more complex configurations, such as deep ERD or 3-D designer type wells, wellbore friction is more prevalent and the hydraulic forces become more pronounced due to high flow rates and high frictional pressure losses. Further, the forces may influence drillstring behavior leading to decreased hookloads, increased surface torque requirements, and increased chances of drillstring buckling. This can impact the drilling rate of penetration (ROP) by reducing the downhole weight-on-bit (DWOB) transfer and also increases the chance of a lock-up of the drillstring.

Embodiments described herein provide for a more accurate simulation of drillstrings in wells made using extend reach drilling (ERD) techniques. The simulations may improve the capability to drill high profile and challenging ERD wells. The simulations include coupling the hydraulic circulation, e.g., fluid flow, effects with current torque and drag modeling capabilities and quantifying the effect of drillstring buckling on DWOB transfer and rotating surface torque requirements. Thus, the modeling predicts the likelihood of buckling of a drillstring in the presence of hydraulic effects and, then, provides a prediction of operability when the drillstring is buckled.

FIG. 1 is a schematic 100 of an extended reach well 102 drilled from a drilling rig 104 into a reservoir 106. The extended reach well 102 includes an outer annulus, or wellbore 108 holding a drillstring 110, which was used to drill the wellbore 108. In this example, the drillstring 110 is buckled and, thus, in contact with the wellbore 108 at numerous points along the wellbore 108. This is discussed further in FIG. 2 for a magnified view 112 of a section of the wellbore 108.

It may also be noted that the extended reach well 102 has three basic angular sections. During the drilling of a vertical section 114, the drillstring 110 may be less likely to buckle, as the drillstring 110 is substantially suspending from the drilling rig 104. In a transition section 116, the angle of the wellbore 108 is changing from vertical to horizontal, and may be at an angle of 10° to 60° from vertical. A final horizontal section 118 may be around 60° to 110°, e.g., slightly rising, from horizontal. Buckling may occur in the horizontal section 118, or at any number of other points along the well, as discussed herein. Any portion of the wellbore 108 may be cased to increase the strength of the walls and protect the well from collapse or infiltration. Generally, casing segments of smaller diameters will be added as the wellbore 108 is drilled with a new, smaller, drill bit used to continue the wellbore 108. For example, a casing might change in size at 100 meters of depth, 1500 m, and 7000 m, depending on the formation. Buckling may occur in a cased section of the wellbore 108 or in an uncased section of the wellbore 108. Embodiments described herein predict whether buckling of the drillstring 110 will occur, what type of buckling, and whether the drillstring 110 is operable, e.g., able to be rotated with the torque available at the drilling rig and able to transmit sufficient downhole weight-on-bit (DWOB).

Forces on a Buckled Pipe

Figure 2A:
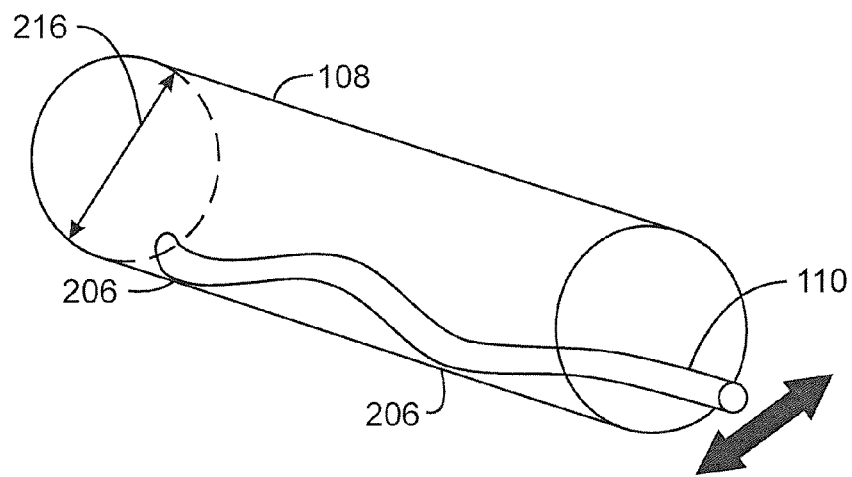
FIG. 2A is a magnified view of a section of a wellbore showing a sinusoidally buckled drillstring.

FIG. 2A is a magnified view 112 of a section of a wellbore 108 showing a sinusoidally buckled drillstring 110. After sinusoidally buckling, the drillstring 110 will touch the walls of the wellbore 108 in a continuous sinusoidal fashion providing additional friction due to an increase of the normal force, which increases the torque needed to turn the drillstring 110 and decreases the DWOB transfer. The drillstring 110 may still be operable when sinusoidal buckling occurs, depending on the torque available from the drilling rig.

The compressive forces on this section of pipe are shown in 2A, as $T_{top}$ 202 and $T_{bot}$ 204 around a contact point 206. $T_{top}$ 202 is the compressive force from portions of the drillstring 110 that are closer to a drilling rig, while $T_{bot}$ 204 is the compressive force from portions of the drillstring 110 that are further from the drilling rig. $W_n$ 208 is the normal reaction at the contact point 206, and F 210 denotes the frictional force provided by wellbore 108 given a coefficient of friction (COF) μ. The COF, μ, can change depending on whether the wellbore 108 is cased or open. For the buckled drillstring 110, P 212 is the pitch, i.e., the distance between contact points 206 between the drillstring 110 and the wellbore 108. The angle of the drillstring 110 when it makes contact with the axis of the wellbore 108 is termed θ 214. The diameter of the wellbore 108 is indicated as $D_h$ 216.

Force balance along and normal to the wellbore axis provides relationship between $T_{top}$ 202 and $T_{bot}$ 204 as illustrated in Eqns. 1-2

$$T_{top} \cos\theta = T_{bot} \cos\theta + F \qquad \text{EQN. 1}$$

$$T_{top} \sin\theta + T_{bot} \sin\theta = W_n \qquad \text{EQN. 2}$$

$$F = \mu W_n \qquad \text{EQN. 3}$$

For a small angle, θ214, the relationship in Eqn. 4 holds.

$$\sin\theta = \tan\theta = \frac{(D_h - D_p)}{P/2} \qquad \text{EQN. 4}$$

If θ 214 is small, the cos θ is about 1 and the relationships in Eqns. 5-7 holds.

$$P = \sqrt{\frac{16\pi^2 EI}{T_{\it eff}}} \qquad \text{EQN. 5}$$

$$(T_{top} + T_{bot})\left(\frac{D_h - D_p}{\frac{P}{2}}\right) = \frac{F}{\mu} \qquad \text{EQN. 6}$$

$$(T_{top} - T_{bot}) = F \qquad \text{EQN. 7}$$

Eliminating F from the two equations provides the reduction of weight-on-bit after each contact point 206.

$$\frac{(T_{top} - T_{bot})}{(T_{top} + T_{bot})} = \mu\left(\frac{D_h - D_p}{\frac{P}{2}}\right) = K \qquad \text{EQN. 8}$$

$$\frac{T_{bot}}{T_{top}} = \frac{1 - K}{1 + K} \qquad \text{EQN. 9}$$

The additional torque per unit length (N-m/m) required for a buckled string is calculated by the formula shown in Eqn. 10.

$$TQ = \mu W_n D_p / 2 \qquad \text{EQN. 10}$$

The incremental torque is added along the string to calculate the cumulative additional torque required at the surface to rotate the buckled drill string.

Figure 2B:
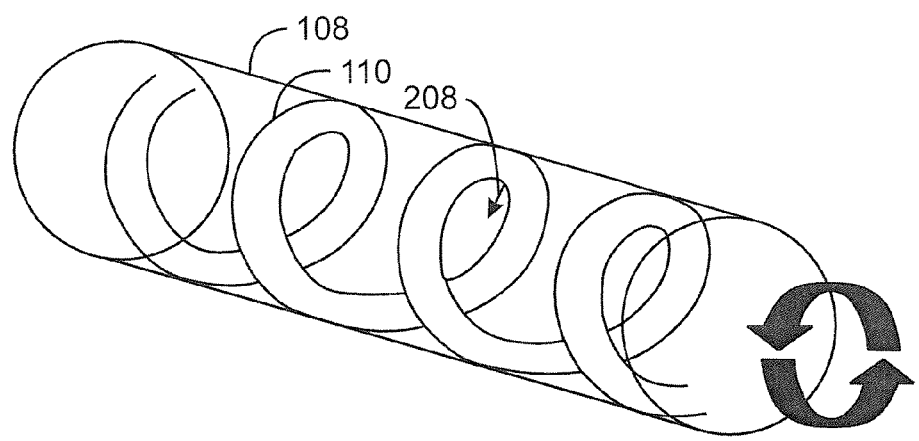
FIG. 2B is a magnified view of a section of a wellbore showing a helically buckled drillstring.

FIG. 2B is a magnified view 112 of a section of a wellbore 108 showing a helically buckled drillstring 110. A buckled drillstring 110 may snap into helical buckling, resulting in the drillstring 110 contacting the wellbore 108 in a continuous spiral fashion providing additional friction due to a further increase of the normal force. The drillstring 110 may still be operable when helical buckling occurs, depending on the torque available from the drilling rig, however the resulting torque may be too high for the drillstring 110 to be rotated and the drillstring could lock up.

Figure 3:
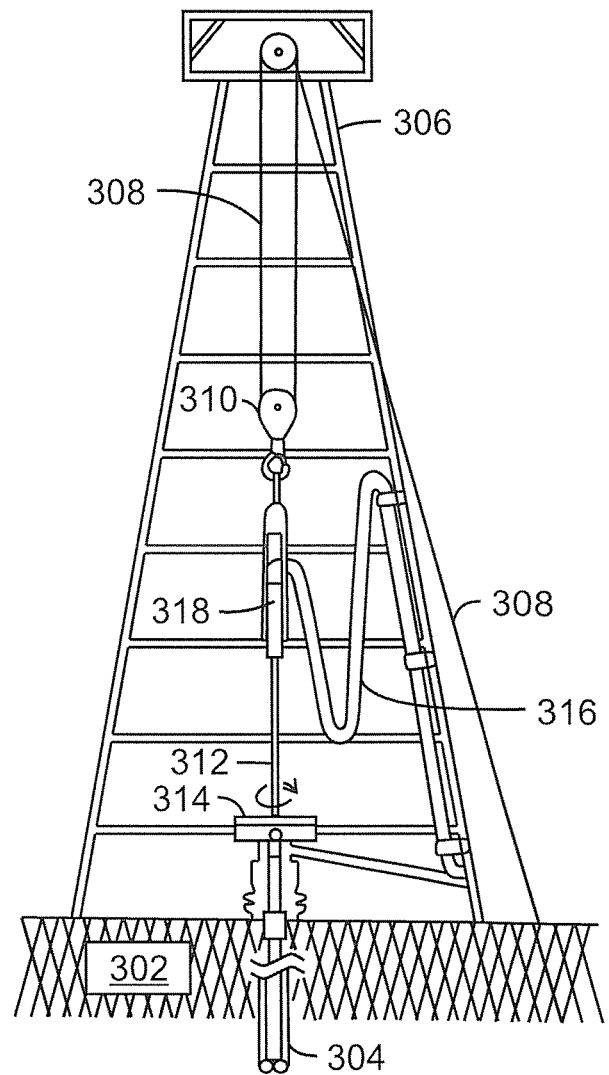
FIG. 3 is a schematic of a drilling rig that can be used to rotate a drillstring in a wellbore.

FIG. 3 is a schematic of a drilling rig 300 that can be used to rotate a drillstring 302 in a wellbore 304, for example, corresponding to drillstring 110 in wellbore 108 as shown in FIGS. 1 and 2. The drilling rig 300 has numerous parts that contribute to the drilling of the wellbore 304, including a derrick 306 used to hold equipment that is suspending the drillstring 302. For simplicity, the description provided herein focuses on the equipment used to rotate the drillstring 302 in the wellbore 304. Any number of other configurations and units may be used, as would be understood by those of skill in the art.

On the drilling rig 300, a drill line 308 is used to raise or lower a traveling block 310, from which the drillstring 302 is suspended. The drillstring 302 is an assembled collection of drill pipe, heavy weight drill pipe, drill collars and any of a whole assortment of tools, connected together and run into the wellbore to facilitate the drilling of a well. Drill pipe is segments of threaded hollow tubing which are assembled into the drillstring 302 and used to connect the surface equipment to a bottom hole assembly (BHA). The drill pipe carries drilling fluid to the drill bit.

The drillstring 302 may be rotated by a Kelly drive 312. The Kelly drive 312 is a square, hexagonal, or octagonal shaped tubing that is inserted through a rotary table 314. The rotary table 314 can be used to apply torque to rotate the drillstring 302. The rotary table 314 rotates, along with its constituent parts, the Kelly drive 312 and Kelly bushing, turning the drillstring and the attached tools and bit. The Kelly drive 312 can move vertically through the rotary table 314 as it is being turned.

A Kelly hose 316 is a flexible, high pressure hose that is used to provide drilling fluids to the drillstring 302. The Kelly hose 316 is connected to a swivel 318 at the top end of the Kelly drive 310. The swivel 316 allows the rotation of the drillstring 302 without twisting the block 310. The Kelly hose 316 allows free vertical movement of the Kelly drive 312, while facilitating the flow of the drilling fluid through the system and down the drillstring. In some rigs, the swivel 316 may include a top drive system to provide a rotary torque instead of, or in addition to, the rotary table 314 and Kelly drive 312.

In embodiments described herein, operability is determined by comparing the torque that can be provided by the equipment on the rig, such as the Kelly drive 312 and rotary table 314, or the top drive, to the predicted torque needed to rotate a buckled drillstring. If the torque is not sufficient, the drilling rig 300 may be upgraded to provide the torque needed. In addition to or instead of upgrading the drilling rig 300, the design of the wellbore 304 or drillstring 302 may be modified to mitigate the buckling.

Figure 4:
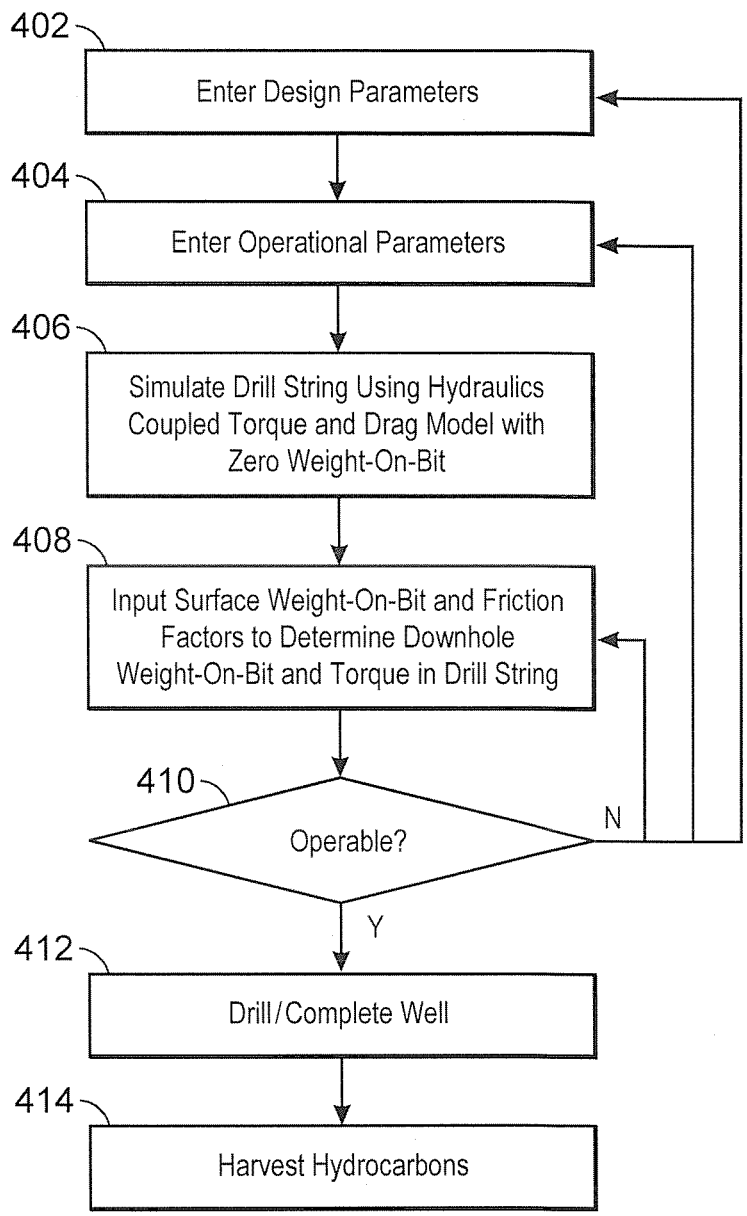
FIG. 4 is a flow chart of a method for determining if a drillstring design is operational.

FIG. 4 is an exemplary flow chart illustration of a method 400 for determining if a drillstring design is operational. The method 400 begins at block 402 with entering the design parameters. Design parameters can include the size of the drillstring, the size of the wellbore, and the well profile. Other design parameters may include drillstring grade, tool joint size, hole size, casing size, well profile or caliper log, surface equipment, and drill bit specifications. At block 404, the operational parameters are entered. The operational parameters may include mud weight, mud rheology, flow rate, pump pressure, pressure losses in the drillstring component, drillstring rotation rate, drillstring eccentricity, wellbore thermal properties, downhole torque on the bit, wellbore friction coefficient, surface weight-on-bit (SWOB), and ROP.

At block 406, a simulation is conducted, having the bit rotating in the hole, off-bottom (e.g., substantially no compressive weight on the bit while its rotating) to assess dynamic frictional forces and establish baseline performance data for the drillstring. This simulation may include a torque and drag simulation and a hydraulics simulation are performed. The torque and drag simulation may be used to calculate the drillstring axial force (tension/compression) profile and rig hookload at the surface, first under static (no fluid flow circulating) conditions, such as by summing the drillstring and wellbore segments starting from the bottom of the string and working back toward the surface, while the drillstring is rotating off bottom with substantially zero WOB. A torque profile also may be compiled from this simulation. The hydraulics simulation also may be used to calculate the wellbore pressures and flow-forces, due to the fluid rheology, pressure, rates, and fluid flow effects. The fluid shear and rheological forces and effective tension may be calculated from the pressures found due to hydraulic circulation effects and may be coupled with the torque and drag results. The end result is a further revised drillstring tension profile reflecting properties when fluid is circulating in the drillstring and wellbore. The torque profile may also be further revised or remain the same for both static and dynamic circulation conditions.

At block 408, surface weight-on-bit (SWOB) and friction factors are selected and applied to the drillstring tension profile that was compiled at block 406, and a "WOB drillstring tension profile" is calculated in a computer model. Surface WOB is selected by presuming a lowering of the drillstring in the hole until the bit touches bottom and begins taking weight thereon, thus reflecting a reduction in tension on the hookload observed at the rig. This "set-off" is merely a selected weight reduction such as may be reflected on the rig weight indicator. A new WOB profile is then calculated by inputting the set-off-adjusted WOB value presumed or observed at the surface and subtracting the body and friction forces along the fictitious segments of drillstring starting from the top of the string down to the drill bit to find the resulting downhole weight-on-bit (DWOB). The normal forces are updated if sinusoidal or helical buckling has occurred to find the tension and torque at each segment of the drillstring. The resulting DWOB (and torque profile) is ultimately a key objective of the preceding steps and calculations. The process of calculating the DWOB in such manner provides a DWOB value that is improved as compared to previous methods, in that the new method considers forces and effects due to buckling and coiling of the drillstring that cannot be accurately determined using the prior art "bottom-up" calculation approach.

At block 410, the finally calculated tension, DWOB, and WOB rotating torque profiles are compared against rig and drillstring component operational limitations to determine whether continued drilling operations are feasible or desirable. For example, one inquiry might be to assess whether the drillstring assembly and operating conditions permit adequate transmission of sufficient DWOB while still rotating the drillstring. If yes, the process flow may move to block 412, at which the well drilling can continue or take place. After the well is drilled and completed, at block 414, hydrocarbons may be harvested or produced from the reservoir using the wellbore or the wellbore may be utilized for related hydrocarbon-harvesting operations, such as for an injection well that supports hydrocarbon harvesting from an adjacent wellbore.

At block 410, a determination may be made as to whether the design is operable or acceptable for drilling operations. As just discussed, at this point a qualitative or quantitative check may be made to see if the impact on operations due to buckling and/or due to improper WOB is negligible or if mitigation or redesign is required. This determination may be made by determining whether the drillstring is predicted to be in a helically buckled or locked up configuration. Other determinations may include comparing the predicted torque for rotating the drillstring to the torque available at the rig or to the torque limitation of the drill pipe. Another comparison that may be made is the change in the WOB as a result of the buckling. If at block 410, it is determined that mitigation of some design parameter issue, operational parameter issue, or other concern is required, process flow may return to block 402 to allow modifications to design parameters or 404 to allow modifications to operational parameters, and/or 408 to enable adjustment of the input surface WOB value, or combinations thereof. If rig limitations are exceeded at block 410 due to drillstring buckling from too much SWOB and/or friction factor being applied, process flow iterates back to block 408. The process can be repeated or iterated, manually or automatically, until a safe drilling scenario exists that is within rig operational limits and maximizes ROP. In other aspects, the process can be repeated or iterated for a range of a particular design parameters, operational parameters, and/or input SWOB values to accommodate construction of a chart or table over the desired range. Such process may enable parameter refinement or construction of an operating window or matrix. If the design is determined to be operable at block 410, process flow proceeds to block 412 for well drilling and completion.

EXAMPLE

As a test of the design process, the method 400 of exemplary FIG. 4 is used to design the drilling program for creating a simulated wellbore. The well profile is similar to that discussed with respect to FIG. 1, e.g., having a vertical segment, an inclined segment, and a horizontal segment. As described with respect to FIG. 4, the design and operational parameters are defined for the well and a hydraulics simulation and a torque and drag simulation are performed. The results from the simulations are coupled together to determine the drillstring tension and torque distribution profiles.

Figure 5:
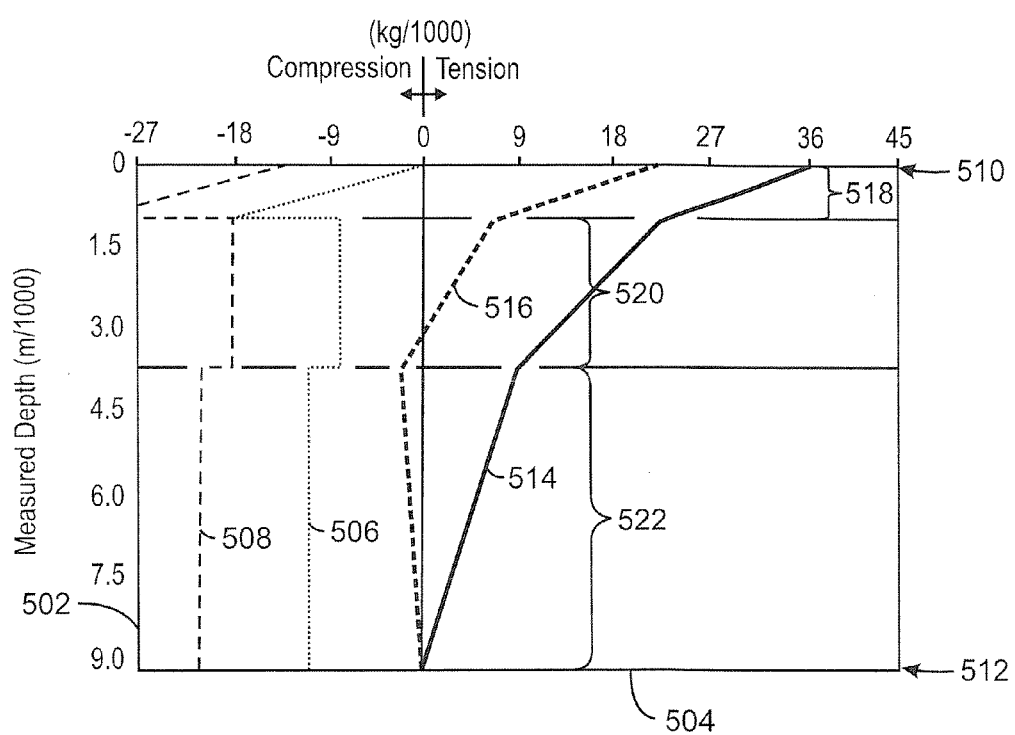
FIG. 5 is a plot of the distribution profile for the drillstring axial force (tension/compression)

FIG. 5 is a plot 500 of the distribution profile for the drillstring axial force (tension/compression) while the drillstring is rotating off bottom, such as according to block 406 of FIG. 4. In FIG. 5, the y-axis 502 presents measured depth in meters (m) divided by 1000, while the x-axis 504 represents tension on the drillstring in kilograms (kg) divided by 1000. The calculated limits for sinusoidal buckling 506 and helical buckling 508 are shown on the plot 500.

When the measured depth 502 is equal to zero (as shown at arrow 510), this indicates the hookload at the rig or surface and when the measured depth 502 is at about 9,000 meters (as shown at arrow 512), this indicates the downhole weight-on-bit (DWOB) at that depth. For this example, the hookload is about 36,000 kg and the DWOB is zero kg since the bit is off-bottom. The solid black line 514 represents the results from a torque and drag simulation without any hydraulics coupling. This is the buoyant weight of the drillstring in the drilling mud with no fluid flow.

However, the flow of the drilling mud through the drillstring and the outer annulus shifts the results. The bold dashed line 516 represents the results from a torque and drag simulation with hydraulics coupling taken into account. It includes the effective tension calculation from the internal and external pressures of the drillstring and the shear forces imparted by the mud flow inside and outside the drillstring. The tension profiles 514 and 516 can then be compared to a calculated limit for sinusoidal buckling 506 and a calculated limit for helical buckling 508.

The tension distribution profile without coupling 514 and with coupling 516 illustrate the importance of including the hydraulic circulation effects. The hydraulic effects shift the coupled tension distribution 516 closer to the buckling limits 506 and 508, lowering any safety factors in the design. Once a basic profile has been generated, the tensioners are slacked off and some weight may be applied to the bit to start the drilling. For example, applying WOB may include shifting the neutral point up the drillstring to some point above drilling collars attached behind the bit.

In this example, and those to follow, the different angular configurations of the well can be seen. The vertical section 518 shows a sharp change in the tension distributions 514 and 516 over the measured depth 502, while the inclined section 520 shows a smaller change in the tension distributions 514 and 516 over the measured depth 502, since some portion of the weight is supported by contact with the wellbore. The nearly horizontal section 522 shows the smallest change in the tension distributions 514 and 516 over the measured depth 502, as much of the weight is supported by the wall of the wellbore.

Figure 6:
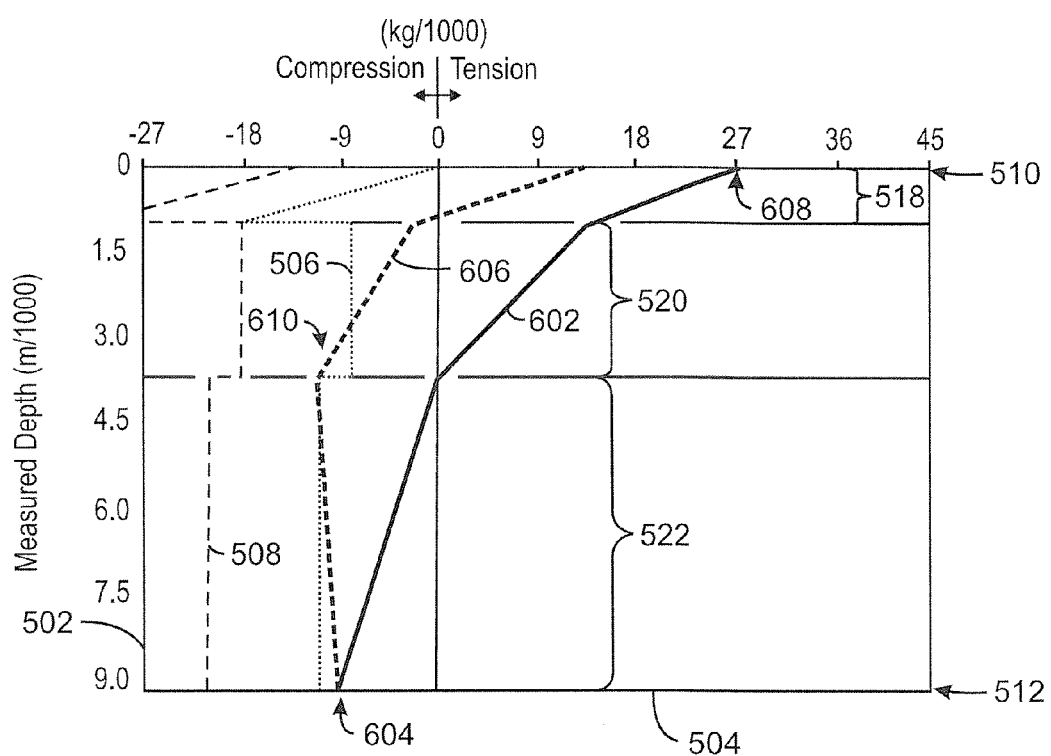
FIG. 6 is a plot of the axial force (tension/compression) distribution profile after applying weight-on-bit (WOB) without frictional forces included.

FIG. 6 is a plot 600 of the tension distribution profile after applying WOB without slackoff (axial) friction forces included. Like numbered items are as described for FIG. 5. The application of surface weight-on-bit (SWOB) causes a shift in the tension profile 602 to the left. In this example, 9,000 kg of SWOB was applied. The hookload decreases by this amount from 36,000 kg to a new value of 27,000 kg, as indicated by an arrow 608. If hydraulics coupling is not considered this would be a satisfactory design, since the decoupled tension curve 602 does not cross, e.g., is not less than, the threshold for sinusoidal buckling 506. However, the coupled tension curve 606 has crossed the buckling limit 506 indicating that sinusoidal buckling of the drillstring likely will occur.

In this example, the downhole weight-on-bit (DWOB) also decreases by this amount from 0 kg to a new value of −9,000 kg, as indicated by an arrow 604. As indicated in the graph, the buckling is likely to occur in the transition from the inclined section 520 to the nearly horizontal section 522, as indicated by an arrow 610. The occurrence of buckling in the drillstring will change the tension in the drillstring, as discussed with respect to FIGS. 7A and 7B.

Figure 7A:
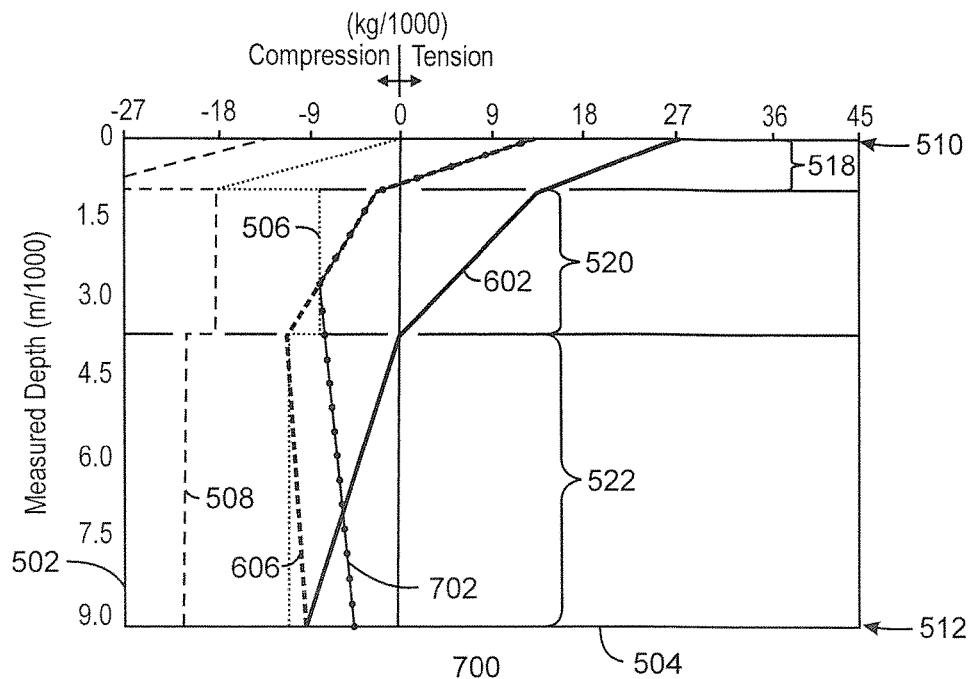
FIG. 7A is a plot of the axial force (tension/compression) distribution profile after the drillstring has buckled with frictional forces included.

FIG. 7A is a plot 700 of the tension distribution profile after the drillstring has buckled with set-off or slackoff (axial) friction forces included at a prescribed friction factor. Similar numbered items are as described with respect to FIGS. 5 and 6. Since the drillstring has buckled, a model is used to determine the impact on operations. Generally, once buckling occurs, the operational requirements increase for torque and there is a loss of axial weight transfer to the drill bit resulting in decreased drilling rates due to increased frictional forces. The tension distribution profiles can be updated based on a model that predicts a new DWOB, providing the plots shown in FIG. 7A.

The buckled tension curve 702 illustrates the results from applying the model from about 2,700 meters downward, i.e., from the point when the coupled tension curve 606 crosses over the sinusoidal buckling limit 506 indicating that buckling has occurred. The buckled tension curve 702 shows a new DWOB of about 4,500 kg at about 9,000 meters, which is a loss of about 4,500 kg from the original 9,000 kg DWOB.

Figure 7B:
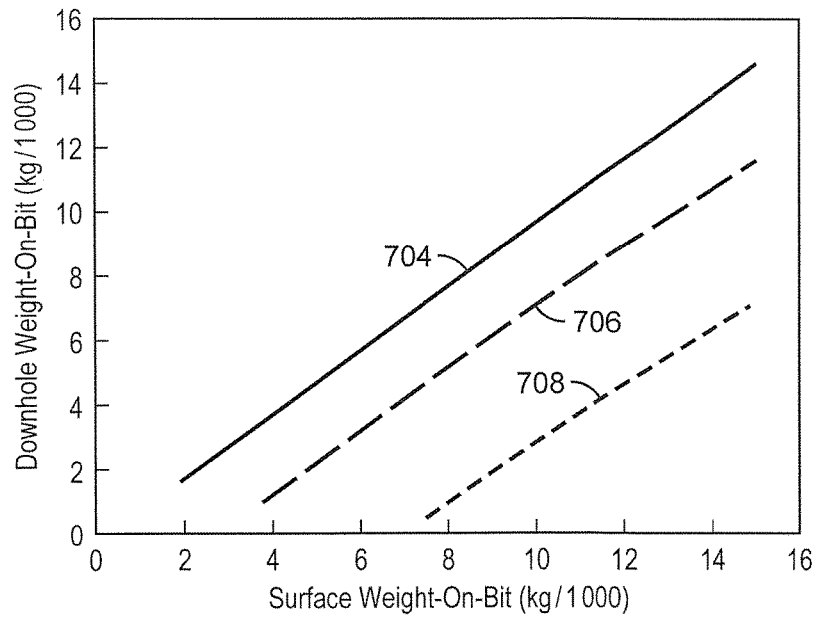
FIG. 7B is a plot of the downhole weight-on-bit (DWOB) as a function of the surface weight-on-bit (SWOB) for different friction factors.

FIG. 7B is a plot of downhole weight-on-bit (DWOB) as a function of the surface weight-on-bit (SWOB) applied from slacking off on the hookload tensioners. The separate curves 704, 706, and 708 represent the efficacy of weight transfer at different values of friction factors (namely, ff=1, ff=2, and ff=3, respectively) based on a sensitivity analysis.

If the desired DWOB cannot be transferred successfully for an estimated friction factor in the wellbore, design and operational parameters can be iterated as discussed with respect to FIG. 4 to improve the deficiency.

After the tension distribution indicates that sufficient DWOB can be transferred to the bit, a torque calculation may be performed to determine if the drillstring is still suitably operable in the calculated state. At this point a check may also be made to determine whether the impact on operations is negligible or if further drillstring or operational mitigation or redesign is required. If mitigation is required, design and operational parameters can be iterated as discussed with respect to FIG. 4.

Figure 8:
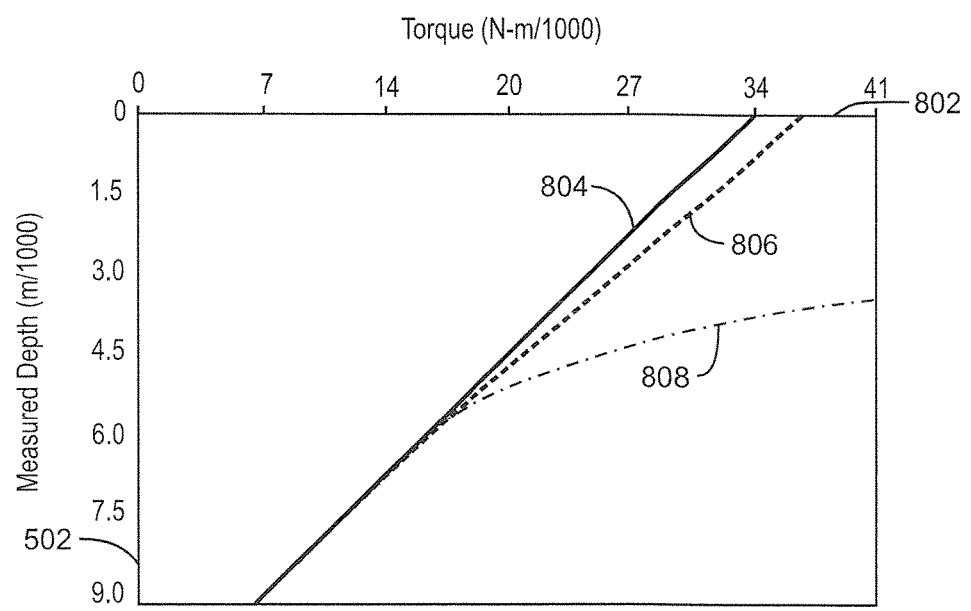
FIG. 8 is a plot of the torque profiles after the drillstring has buckled.

FIG. 8 is a plot 800 of the torque profiles after the drillstring has buckled. In FIG. 8, the x-axis 802 represents the torque applied to rotate the drillstring in Newton meters (N-m). Like-numbered items in FIG. 8 are as described with respect to FIG. 5. The decoupled torque curve 804 reflects a required surface torque of about 34,000 N-m to rotate the drillstring. After the drillstring is predicted to buckle, a model can be applied to find the increase in torque requirements for rotating the drill string in the buckled condition. Buckled torque curve 806 illustrates the results from applying such model. There is an increase in the torque at the surface indicating that more torque, about 37,000 N-m, is required to rotate a buckled drillstring. The torque profile can then be compared against limitations of the equipment on the rig to ensure that the planned operations are within a normal operating range. Further, the model can calculate the torque due to helical buckling, as shown for the helical torque curve 808, which also predicts that the drill string is locked up.

Exemplary Cluster Computing System

Figure 9:
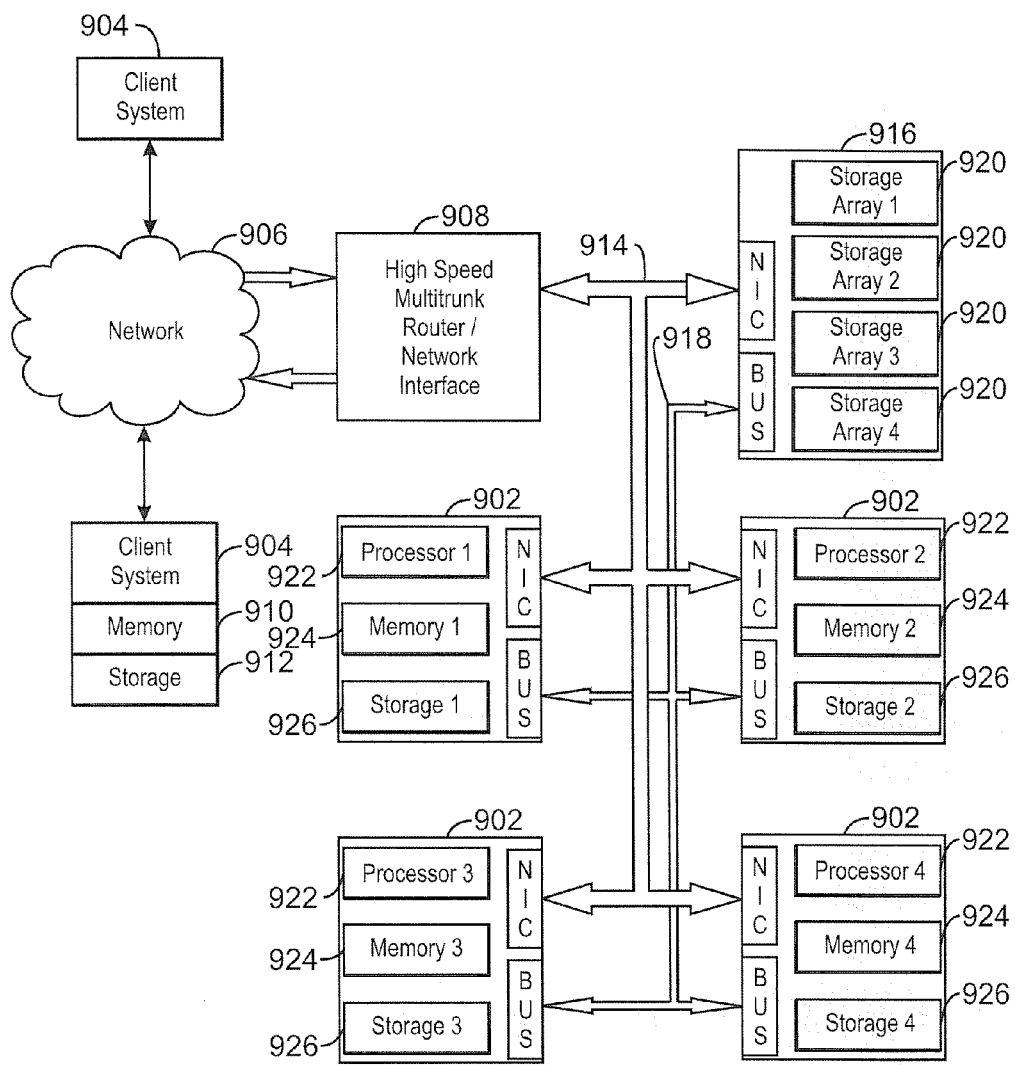
FIG. 9 is a block diagram of an exemplary cluster computing system that may be used in embodiments.

FIG. 9 is a block diagram of an exemplary cluster computing system 900 that may be used in embodiments. The cluster computing system 900 illustrated has four computing units 902, each of which may perform calculations for part of the simulation model. However, embodiments are not limited to this configuration, as any number of computing configurations may be selected. For example, a small simulation model may be run on a single computing unit 902, such as a workstation or personal computer, while a large simulation model may be run on a cluster computing system 900 having 10, 100, 1000, or even more computing units 902.

The cluster computing system 900 may be accessed from one or more client systems 904 over a network 906, for example, through a high speed network interface 908. The network 906 may include a local area network (LAN), a wide area network (WAN), the Internet, or any combinations thereof. Each of the client systems 904 may have non-transitory, computer readable memory 910 for the storage of operating code and programs, including random access memory (RAM) and read only memory (ROM). The operating code and programs may include the code used to implement all or any portion of the methods discussed herein, for example, as discussed with respect to FIG. 4. Further, the non-transitory computer readable media may hold a data representation of a physical hydrocarbon reservoir and a wellbore configuration. The client systems 904 can also have other non-transitory, computer readable media, such as storage systems 912. The storage systems 912 may include one or more hard drives, one or more optical drives, one or more flash drives, any combinations of these units, or any other suitable storage device. The storage systems 912 may be used for the storage of code, models, data, and other information used for implementing the methods described herein. For example, the data storage system may hold a data representation of a wellbore and drillstring, a torque and drag model, a hydraulics model, and the like.

The high speed network interface 908 may be coupled to one or more busses in the cluster computing system 900, such as a communications bus 914. The communication bus 914 may be used to communicate instructions and data from the high speed network interface 908 to a cluster storage system 916 and to each of the computing units 902 in the cluster computing system 900. The communications bus 914 may also be used for communications among computing units 902 and the storage array 916. In addition to the communications bus 914 a high speed bus 918 can be present to increase the communications rate between the computing units 902 and/or the cluster storage system 916.

The cluster storage system 916 can have one or more tangible, computer readable media devices, such as storage arrays 920 for the storage of data, visual representations, results, code, or other information, for example, concerning the implementation of and results from the methods of FIG. 4. The storage arrays 920 may include any combinations of hard drives, optical drives, flash drives, holographic storage arrays, or any other suitable devices.

Each of the computing units 902 can have a processor 922 and associated local tangible, computer readable media, such as memory 924 and storage 926. The memory 924 may include ROM and/or RAM used to store code, for example, used to direct the processor 922 to implement the method illustrated in FIG. 4. The storage 926 may include one or more hard drives, one or more optical drives, one or more flash drives, or any combinations thereof. The storage 926 may be used to provide storage for intermediate results, data, images, or code associated with operations, including code used to implement the method of FIG. 4.

The present techniques are not limited to the architecture or unit configuration illustrated in FIG. 9. For example, any suitable processor-based device may be utilized for implementing all or a portion of embodiments of the present techniques, including without limitation personal computers, networks personal computers, laptop computers, computer workstations, GPUs, mobile devices, and multi-processor servers or workstations with (or without) shared memory. Moreover, embodiments may be implemented on application specific integrated circuits (ASICs) or very large scale integrated (VLSI) circuits. In fact, persons of ordinary skill in the art may utilize any number of suitable structures capable of executing logical operations according to the embodiments.

Figure 10:
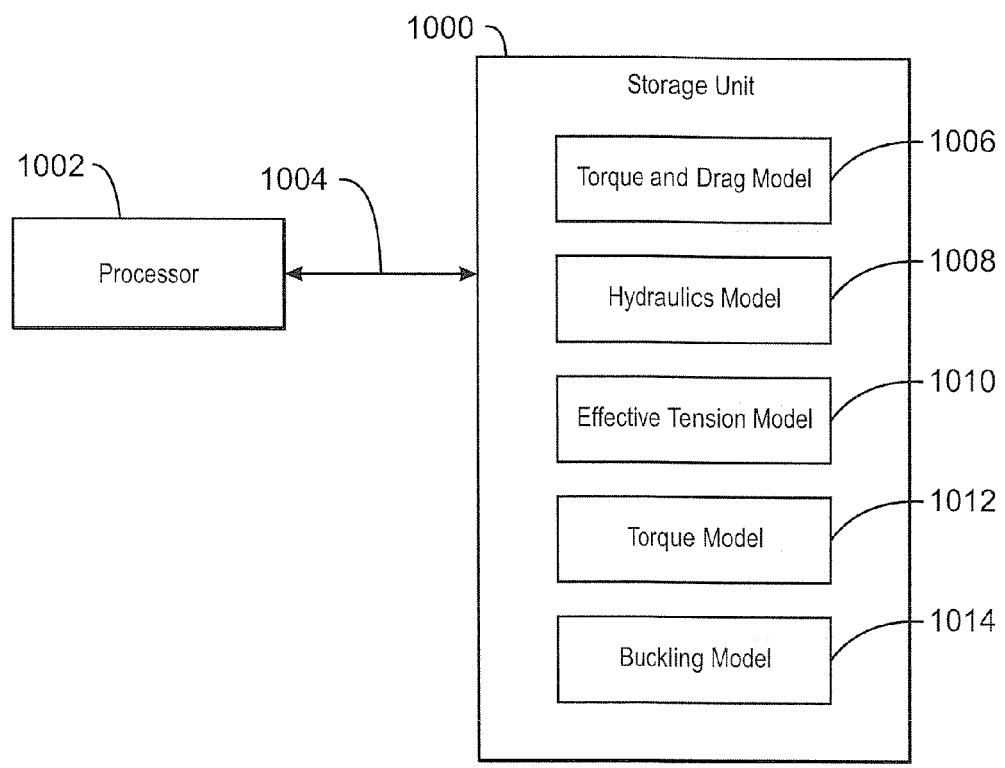
FIG. 10 is a non-transitory computer readable medium or storage device used for storage of models and code used to implement embodiments described herein.

FIG. 10 is a non-transitory computer readable medium or storage device 1000 used for storage of models and code used to implement embodiments described herein. The storage device 1000 may include a memory device, a hard disk, or any number of other devices as described with respect to FIG. 9. A processor 1002 may access the storage device 1000 over a bus or network 1004. The storage unit 1000 includes a torque and drag model 1006 and a hydraulics model 1008. A module 1010, or code, can be used to calculate effective tension, coupling the hydraulics model to the torque and drag model. A torque module 1012 can be used to calculate predicted torque requirements to rotate a drillstring in a wellbore. A buckling module 1014 can be used to determine if buckling has occurred in the drillstring.

Exemplary Embodiments of the Invention

Embodiments described herein may include any number of elements, and variations, such as described in the following numbered paragraphs:

1. A method for designing a drillstring to drill a borehole for creating a wellbore, the method comprising the steps of:
   determining drillstring design parameters and identifying equipment operational torque limits;
   determining drilling operational parameters;
   calculating both a baseline drillstring tension profile and a baseline drillstring rotating torque profile, while rotating the drillstring off bottom;
   providing non-transitory computer readable instructions to a computer processor and inputting into the processor (i) a surface WOB value with bit on bottom and in a rotating mode, (ii) the baseline drillstring tension profile and (iii) the baseline drillstring rotating torque profile, to calculate a WOB drillstring tension profile and a WOB rotating torque profile; and
   adjust at least one of the drillstring design parameters and drilling operational parameters if the determined WOB rotating torque profile exceeds the identified equipment operational torque limits.

2. The method of paragraph 1 further comprising identifying the downhole WOB from the calculated WOB drillstring tension profile, and identifying the downhole torque at the bit from the calculated WOB rotating torque profile.

3. The method of paragraph 1, further comprising:
   inputting into the processor (i) a range of surface WOB values with bit on bottom and in a rotating mode to calculate a corresponding range of WOB drillstring tension profiles for the drillstring design parameters and the operational parameters.

4. The method of paragraph 2, further comprising:
   inputting into the processor (i) a range of surface WOB values with bit on bottom and in a rotating mode to calculate a corresponding range of downhole WOB values of WOB at the bit for the drillstring design parameters and the operational parameters.

5. The method of paragraph 1, further comprising:
   inputting into the processor (i) a range of surface WOB values with bit on bottom and in a rotating mode to calculate a corresponding range of downhole WOB rotating torque profiles for the drillstring design parameters and the operational parameters.

6. The method of paragraph 2, further comprising:
   inputting into the processor (i) a range of surface WOB values with bit on bottom and in a rotating mode to calculate a corresponding range of downhole torque at the bit for the drillstring design parameters and the operational parameters.

7. The method of paragraph 1, wherein determining the drillstring design parameters comprises determining at least two of a well path survey, hole size, casing size, drilling string properties, drill bit properties, and mud properties.

8. The method of paragraph 1, wherein determining the operational parameters comprises determining at least two of drilling fluid circulation rate, drilling fluid rheological properties, friction factors, rate of penetration, drill string rotating speed, and surface torque on the drill string.

9. The method of paragraph 8, further comprising determining friction factors by at least one of a) data from offset wells, b) performing Slack Off test, Pick Up test, rotating tests on the rig, and c) model calibration using Downhole Weight-on-Bit sensor data.

10. The method of paragraph 1, wherein determining the drillstring tension profile and rotating torque profile further comprises coupling a torque and drag model with a hydraulic model to determine fluid flow effects.

11. The method of paragraph 1, comprising calculating the baseline drillstring tension profile and the baseline drillstring rotating torque profile by performing calculations substantially sequentially from the drill bit and calculating along the drill string toward the surface to find define a baseline surface hook-load.

12. The method of paragraph 1, comprising calculating the baseline drillstring rotating torque profile by performing calculations substantially sequentially from the drill bit toward the surface to define the find a baseline surface torque.

13. The method of paragraph 1, comprising calculating the WOB drillstring tension profile and the WOB rotating torque profile by selecting and inputting the selected surface weight on bit value and calculating the WOB drillstring tension profile using the baseline solution, by performing calculations substantially sequentially from the surface and calculating along the drill string toward the bit to define WOB and the WOB drillstring tension profile and WOB rotating torque profile.

14. The method of paragraph 13, wherein the selected surface weight on bit is determined by slacking off on the hook load a selected amount from the weight of the drill string on the hook with the drill bit rotating off-bottom.

15. The method of paragraph 1, wherein at least a portion of the tension profile is less than a first buckling limit indicates sinusoidal buckling.

16. The method of paragraph 2, wherein at least a portion of the tension profile is less than a second buckling limit indicates helical buckling.

17. The method of paragraph 1, comprising determining whether the drillstring is operable for drilling purposes by comparing the torque required to rotate the drillstring to at least one of (i) a torque provided by a drilling rig and (2) a maximum torque limit of the drill string.

18. The method of paragraph 15, comprising determining whether the drillstring is operable in a sinusoidally buckled configuration by comparing the torque required to rotate the drillstring to at least one of (i) a torque provided by a drilling rig and (2) a maximum torque limit of the drill string.

19. The method of paragraph 16, comprising determining whether the drillstring is operable in a helically buckled configuration by comparing the torque required to rotate the drillstring to a torque provided by a drilling rig and the maximum make up torque of the drill string.

20. The method of paragraph 1, wherein identifying equipment operational torque limits further comprises defining an operable torque range and an operable tensile range for the drill string components.

21. The method of paragraph 20 wherein adjusting the at least one of the drill string design parameters and determining drilling operational parameters further comprises iteratively modifying at least one of the design parameters, the operational parameters, and the surface WOB value with bit on bottom and in a rotating mode, and repeating calculating the baseline profiles and the WOB profiles until the calculated baseline profiles and WOB profiles indicate that drillstring is in an operable range.

22. The method of paragraph 21, comprising halting the iteration when the results indicate that a torque for rotating the drillstring is in an operational range and there is sufficient downhole weight on bit transferred for drilling.

23. The method of paragraph 1, further comprising inputting into the processor (iv) friction factors, to calculate the WOB drillstring tension profile and the WOB rotating torque profile.

24. A system for designing a drillstring, comprising:
   a processing unit configured to implement modules; and
   a storage device, wherein the storage device comprises:
      a torque and drag model of a drillstring;

a hydraulics model of the drillstring;
a module configured to calculate a baseline drillstring tension profile and a baseline drillstring rotating torque profile rotating off bottom with zero downhole weight on bit;
a module configured to calculate a downhole WOB by inputting a surface WOB value and calculating a WOB drillstring tension profile and a WOB rotating torque profile in a rotating mode based upon the input surface WOB value.

25. The system of paragraph 24, further comprising a module configured to calculate a buckling limit for the drillstring, based, at least in part, on a well design.

26. The system of paragraph 25, further comprising a module configured to determine if the tension on the drillstring is less than a sinusoidal buckling limit.

27. The system of paragraph 25, further comprising a module configured to determine if the tension on the drillstring is less than a helical buckling limit.

28. The system of paragraph 24, further comprising a module configured to calculate a change in a weight-on-bit parameter for a drillstring before and after buckling.

29. The system of paragraph 24, further comprising a module configured to iterate through a calculation of the tension to determine design changes that minimize buckling.

30. The system of paragraph 29, further comprising processor instructions to stop the iteration if the torque used to rotate the drillstring is in an operational range and sufficient downhole weight-on-bit (DWOB) can be transferred.

31. A method for harvesting a hydrocarbon from a reservoir, comprising:
modeling a design for a well using a torque and drag model coupled to a hydraulics model to determine an effective tension in a drillstring in the well;
comparing the effective tension to a calculated limit to determining if buckling is likely to occur in the drillstring and, if buckling is likely to occur, calculating a torque for rotating the drillstring;
adjusting the design to keep the torque within operational limits for a rig;
drilling the well to the reservoir following the design;
completing the well; and
harvesting hydrocarbons from the reservoir.

32. The method of paragraph 31, comprising iterating the modeling of the design and the comparison of the tension to a calculated limit to lower the probability of buckling in the drillstring.

33. The method of paragraph 31, comprising using the model to adjust the design during the drilling of the well.

34. A non-transitory computer readable medium comprising code configured to direct a processing unit to:
calculate a baseline drillstring tension profile and a baseline drillstring rotating torque profile rotating off bottom with zero downhole weight on bit;
calculate a downhole WOB by inputting a surface WOB value and calculating a WOB drillstring tension profile and a WOB rotating torque profile in a rotating mode;
compare the tension to a buckling limit to determine if a modeled drillstring would be buckled; and
determine if the drillstring would be operable in a buckled configuration; and
determine the DWOB transferred by the buckled drillstring.

35. The non-transitory computer readable medium of paragraph 34, comprising code configured to calculate a torque for rotating the drillstring.

36. The non-transitory computer readable medium of paragraph 34, comprising code configured to model the drillstring using a torque and drag model coupled to a hydraulics model.

While the present techniques may be susceptible to various modifications and alternative forms, the embodiments discussed above have been shown only by way of example. However, it should again be understood that the present techniques are not intended to be limited to the particular embodiments disclosed herein. Indeed, the present techniques include all alternatives, modifications, and equivalents falling within the true spirit and scope of the appended claims.

What is claimed is:

1. A method for designing a drillstring to drill a borehole for creating a wellbore, the method comprising the steps of:
determining drillstring design parameters and identifying equipment operational torque limits;
determining drilling operational parameters;
calculating both a baseline drillstring tension profile and a baseline drillstring rotating torque profile, while rotating the drillstring off bottom;
providing non-transitory computer readable instructions to a computer processor and inputting into the processor (i) a surface WOB value with bit on bottom and in a rotating mode, (ii) the baseline drillstring tension profile and (iii) the baseline drillstring rotating torque profile, to calculate a WOB drillstring tension profile and a WOB rotating torque profile; and
adjust at least one of the drillstring design parameters and drilling operational parameters if the determined WOB rotating torque profile exceeds the identified equipment operational torque limits;
selecting a drillstring design from at least one of (i) the determined drill string design parameters and (ii) an adjusted drillstring design parameters, for drilling the borehole;
selecting the drilling operational parameters from at least one of (a) the determined drilling operational parameters and (b) an adjusted drilling operational parameters; and
drilling the borehole by operating the drillstring with the selected drillstring design at the selected drilling operational parameters.

2. The method of claim 1 further comprising identifying the downhole WOB from the calculated WOB drillstring tension profile, and identifying the downhole torque at the bit from the calculated WOB rotating torque profile.

3. The method of claim 2, further comprising:
inputting into the processor (i) a range of surface WOB values with bit on bottom and in a rotating mode to calculate a corresponding range of downhole WOB values of WOB at the bit for the drillstring design parameters and the operational parameters.

4. The method of claim 2, further comprising:
inputting into the processor (i) a range of surface WOB values with bit on bottom and in a rotating mode to calculate a corresponding range of downhole torque at the bit for the drillstring design parameters and the operational parameters.

5. The method of claim 2, wherein at least a portion of the tension profile is less than a second buckling limit indicates helical buckling.

6. The method of claim 5, comprising determining whether the drillstring is operable in a helically buckled configuration by comparing the torque required to rotate the drillstring to a torque provided by a drilling rig and the maximum make up torque of the drill string.

7. The method of claim 1, further comprising:
inputting into the processor (i) a range of surface WOB values with bit on bottom and in a rotating mode to calculate a corresponding range of WOB drillstring tension profiles for the drillstring design parameters and the operational parameters.

8. The method of claim 1, further comprising:
inputting into the processor (i) a range of surface WOB values with bit on bottom and in a rotating mode to calculate a corresponding range of downhole WOB rotating torque profiles for the drillstring design parameters and the operational parameters.

9. The method of claim 1, wherein determining the drillstring design parameters comprises determining at least two of a well path survey, hole size, casing size, drilling string properties, drill bit properties, and mud properties.

10. The method of claim 1, wherein determining the operational parameters comprises determining at least two of drilling fluid circulation rate, drilling fluid rheological properties, friction factors, rate of penetration, drill string rotating speed, and surface torque on the drill string.

11. The method of claim 10, further comprising determining friction factors by at least one of a) data from offset wells, b) performing Slack Off test, Pick Up test, rotating tests on the rig, and c) model calibration using Downhole Weight-on-Bit sensor data.

12. The method of claim 1, wherein determining the drillstring tension profile and rotating torque profile further comprises coupling a torque and drag model with a hydraulic model to determine fluid flow effects.

13. The method of claim 1, comprising calculating the baseline drillstring tension profile and the baseline drillstring rotating torque profile by performing calculations substantially sequentially from the drill bit and calculating along the drill string toward the surface to find define a baseline surface hook-load.

14. The method of claim 1, comprising calculating the baseline drillstring rotating torque profile by performing calculations substantially sequentially from the drill bit toward the surface to define the find a baseline surface torque.

15. The method of claim 1, comprising calculating the WOB drillstring tension profile and the WOB rotating torque profile by selecting and inputting the selected surface weight on bit value and calculating the WOB drillstring tension profile using the baseline solution, by performing calculations substantially sequentially from the surface and calculating along the drill string toward the bit to define WOB and the WOB drillstring tension profile and WOB rotating torque profile.

16. The method of claim 15, wherein the selected surface weight on bit is determined by slacking off on the hook load a selected amount from the weight of the drill string on the hook with the drill bit rotating off-bottom.

17. The method of claim 1, wherein at least a portion of the tension profile is less than a first buckling limit indicates sinusoidal buckling.

18. The method of claim 17, comprising determining whether the drillstring is operable in a sinusoidally buckled configuration by comparing the torque required to rotate the drillstring to at least one of (i) a torque provided by a drilling rig and (2) a maximum torque limit of the drill string.

19. The method of claim 1, comprising determining whether the drillstring is operable for drilling purposes by comparing the torque required to rotate the drillstring to at least one of (i) a torque provided by a drilling rig and (2) a maximum torque limit of the drill string.

20. The method of claim 1, wherein identifying equipment operational torque limits further comprises defining an operable torque range and an operable tensile range for the drill string components.

21. The method of claim 20 wherein adjusting the at least one of the drill string design parameters and determining drilling operational parameters further comprises iteratively modifying at least one of the design parameters, the operational parameters, and the surface WOB value with bit on bottom and in a rotating mode, and repeating calculating the baseline profiles and the WOB profiles until the calculated baseline profiles and WOB profiles indicate that drillstring is in an operable range.

22. The method of claim 21, comprising halting the iteration when the results indicate that a torque for rotating the drillstring is in an operational range and there is sufficient downhole weight on bit transferred for drilling.

23. The method of claim 1, further comprising inputting into the processor (iv) friction factors, to calculate the WOB drillstring tension profile and the WOB rotating torque profile.

24. A system for designing a drillstring for drilling a wellbore, comprising:
a processing unit configured to implement modules; and
a storage device, wherein the storage device comprises:
a torque and drag model of a drillstring;
a hydraulics model of the drillstring;
a module configured to receive a selected drillstring design, identified equipment operational torque limits, and drilling operational parameters, and calculate a baseline drillstring tension profile and a baseline drillstring rotating torque profile rotating off bottom with zero downhole weight on bit for the selected drillstring design;
a module configured to calculate for the selected drillstring design a downhole WOB by inputting a surface WOB value and calculating (i) a WOB drillstring tension profile and (ii) WOB rotating torque profile in a rotating mode based upon the input surface WOB value, the calculated baseline drillstring tension profile, and the calculated baseline drillstring torque profile; and
a drilling rig including drill string equipment for the selected drillstring design suitable for drilling the wellbore using the calculated WOB drillstring tension profile and the calculated WOB rotating torque profile in the rotating mode based upon the input surface WOB value.

25. The system of claim 24, further comprising a module configured to calculate a buckling limit for the drillstring, based, at least in part, on a well design.

26. The system of claim 25, further comprising a module configured to determine if the tension on the drillstring is less than a sinusoidal buckling limit.

27. The system of claim 25, further comprising a module configured to determine if the tension on the drillstring is less than a helical buckling limit.

28. The system of claim 24, further comprising a module configured to calculate a change in a weight-on-bit parameter for a drillstring before and after buckling.

29. The system of claim 24, further comprising a module configured to iterate through a calculation of the tension to determine design changes that minimize buckling.

30. The system of claim 29, further comprising processor instructions to stop the iteration if the torque used to rotate the drillstring is in an operational range and sufficient downhole weight-on-bit (DWOB) can be transferred.

* * * * *